United States Patent [19]

Grebe, Jr. et al.

[11] 4,309,909
[45] Jan. 12, 1982

[54] CRYSTAL STABILIZED VOLTAGE TO FREQUENCY CONVERTER WITH DIGITAL CALIBRATION FOR FLOWMETERS

[75] Inventors: John C. Grebe, Jr., Norristown; William R. Freund, Jr., Hatfield, both of Pa.

[73] Assignee: Emerson Electric Co., St. Louis, Mo.

[21] Appl. No.: 82,765

[22] Filed: Oct. 9, 1979

[51] Int. Cl.³ .............................................. G01F 1/60
[52] U.S. Cl. ............................. 73/861.12; 73/861.16; 73/861.77
[58] Field of Search ................ 73/3, 861.12, 861.16, 73/861.17, 861.08, 861.77

[56] References Cited

U.S. PATENT DOCUMENTS

| 3,260,109 | 7/1966 | Schmoock | 73/861.16 |
| 4,089,219 | 5/1978 | Suzuki | 73/861.16 |
| 4,167,871 | 9/1979 | Shauger et al. | 73/861.16 |

*Primary Examiner*—Charles A. Ruehl
*Attorney, Agent, or Firm*—Polster, Polster and Lucchesi

[57] ABSTRACT

A voltage controlled oscillator (VCO) system includes a feedback loop for maintaining the linearity, temperature stability and accuracy of the VCO. The feedback loop includes means for producing a fed-back train of pulses having an amplitude equal to a reference voltage and a duty cycle proportional to the ratio of the frequency of the output of the VCO to a reference frequency. The output frequency is thereby made proportional to the input voltage times the ratio of the reference frequency to the reference voltage.

10 Claims, 3 Drawing Figures

CRYSTAL STABILIZED VOLTAGE TO FREQUENCY CONVERTER WITH DIGITAL CALIBRATION FOR FLOWMETERS

BACKGROUND OF THE INVENTION

This invention relates to a voltage controlled oscillator system. It has particular utility in a magnetic flowmeter system and will be described as applied to such a system, but its utility is not limited thereto. The invention also relates to a digitally calibrated flowmeter system which may embody the voltage controlled oscillator system.

Fluid flowmeters produce an output signal which is indicative of flow rate. In the case of a magnetic flowmeter, a magnetic field across a flow tube generates in the fluid a voltage which is proportional to the flow rate. This voltage is sensed by a pair of electrodes in contact with the fluid and amplified by a signal processing system. The output of the processing system is generally in the form of a DC (analog) signal, the magnitude (voltage) of which is proportional to flow rate.

In presently known magnetic flowmeters, a number of potentiometer adjustments must be made in order to calibrate the meter properly and to set the zero point accurately. These adjustments must be made by trained technicians, and once made are nonetheless susceptible to vibration and humidity. In presently known meters, the number of adjustments necessary has made digital calibration impractical. The number of adjustments is not made necessary by the flow signal, which varies in a highly linear manner with flow rate, but by the offset and non-linear response of the signal processing circuitry.

In certain magnetic flowmeters, the analog signal output is converted to a digital signal, such as a train of pulses, the frequency or duty cycle of which is proportional to flow rate. For such flowmeters, a voltage to frequency converter such as a voltage controlled oscillator would be a particularly convenient means of producing the output signals. Unfortunately, conventional voltage to frequency converters have a temperature coefficient of fifty parts per million per degree Celsius or more, which makes them unacceptable for high precision systems.

SUMMARY OF THE INVENTION

One of the objects of this invention is to provide a precision voltage to frequency converter system having low offset, precise linearity and low sensitivity to temperature changes, and suitable for use in a magnetic flowmeter.

Another object is to provide a magnetic flowmeter incorporating such a system.

Another object is to provide such a flowmeter which may be precisely calibrated by means of a plurality of digital switches, each representing one digit of a multiple digit calibration constant.

Another object is to provide such a flowmeter which permits digital scaling of the output.

Other objects are best understood with reference to the following description and accompanying drawings.

In accordance with one aspect of this invention, generally stated, a voltage to frequency converter system is provided which includes a reference voltage source and a reference frequency source arranged such that the ratio of the input voltage to the reference voltage is proportional to the ratio of the output frequency to the reference frequency. The voltage to frequency converter is arranged as a novel frequency to voltage converter connected in a feedback loop with a high gain amplifier and a voltage controlled oscillator (VCO) so that the output of the frequency to voltage converter matches the input voltage. The frequency necessary to achieve the match is the output frequency. The novel frequency to voltage converter forms another aspect of the invention.

More particularly, the system includes a frequency generating means for receiving a variable voltage signal and producing a variable frequency output signal dependent on the amplitude of the variable voltage signal. Linearity is achieved by feedback means for receiving the output signal and producing a feedback signal having an amplitude dependent on the frequency of the output signal. The feedback means comprise means for generating a reference frequency, means for generating a reference voltage, and means responsive to the variable frequency output signal, to the reference frequency and to the reference voltage for producing a feedback signal having a voltage substantially equal to the voltage of the input signal. Preferably, the frequency to voltage converter of the feedback means includes a trigger circuit which receives the frequency output of the VCO and enables the passage of one pulse of which proportional to the period of the reference frequency for each M pulses or cycles of the VCO, and a switching circuit which produces a pulse of the same width as the pulse from the trigger circuit and the amplitude of the reference voltage.

By utilizing a programmable digital to analog converter to control the value of the reference voltage, digital calibration is easily achieved. A separate digit for each digit of a calibration constant may be entered into the digital to analog converter in the process of calibrating the meter, and thereafter the calibration is not subject to change. Because of the highly linear response of the meter, only a single calibration is required. Zeroing may be eliminated by the use of a low offset operational amplifier as a servo amplifier. The reference frequency is preferably a highly stable crystal controlled oscillator.

Special circuitry is provided to permit a 100% duty cycle, i.e. to permit the trigger circuit to pass each pulse of the reference frequency when the reference frequency and the output frequency are equal.

Other aspects of the invention will become apparent in light of the following description of the preferred embodiment of the invention.

DESCRIPTION OF THE PREFERRED EMBODIMENT

Figure 1:
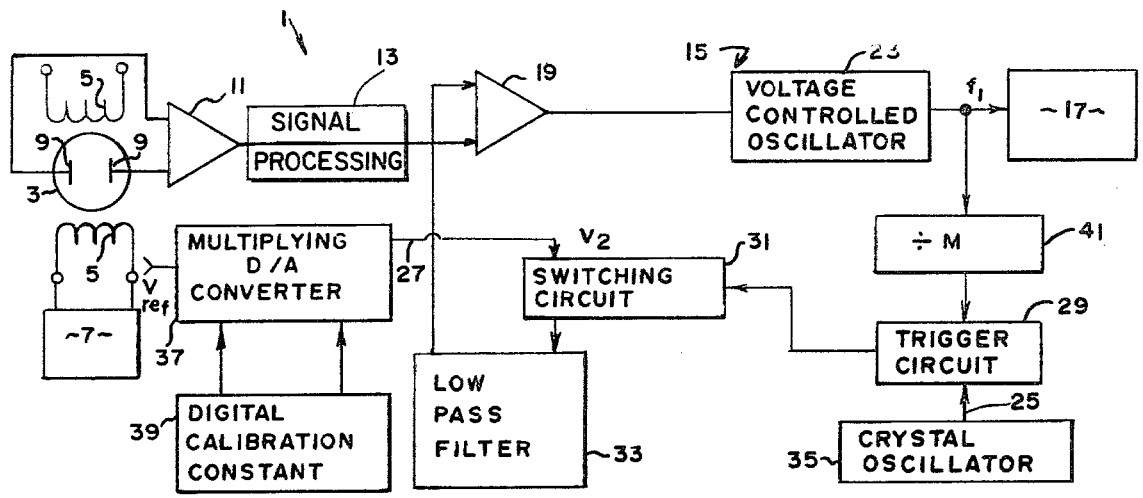
FIG. 1 is a block diagram of a magnetic flowmeter incorporating a digitally calibrated voltage to frequency converter of the present invention.

Referring now to the drawings, and in particular to FIG. 1, reference numeral 1 indicates a magnetic flowmeter system incorporating the present invention. The flowmeter system 1 includes a flow tube 3, a pair of oppositely disposed electomagnetic coils 5 energized from a source 7, and a pair of electrodes 9 which sense a voltage generated by the flow of an electrically conductive fluid through the magnetic field produced by the coils 5 across the tube 3. The voltage across the electrodes 9 is amplified by a preamplifier 11 and a signal processing chain 13. All of these components may be conventional.

The output voltage of the signal processing chain 13 is fed through a voltage to frequency converter 15 of the present invention to an output device 17, which may be a conventional frequency converting display or processor.

The voltage to frequency converter 15 includes a low offset operational amplifier 19, the non-inverting input of which is connected to receive the flow dependent voltage from the signal processing chain 13. The output of operational amplifier 19 is connected to the input of a voltage controlled oscillator 23, the output of which is a frequency proportional to flowrate.

The output of the voltage controlled oscillator 23 is also connected through a feedback circuit to the inverting input of the operational amplifier 19. The feedback circuit includes a high precision frequency to voltage converter, having a digitally selectable calibration constant.

The feedback circuit includes a reference frequency source 25, a reference voltage source 27, a trigger circuit 29 and a switching circuit 31, and a low pass filter 33.

The reference frequency source 25 includes a crystal oscillator 35, connected to the input of trigger circuit 29.

The reference voltage source 27 includes a source voltage which may preferably be tied to the source 7 for the coils 5 so as to compensate for variations in the field strength generating the flow generated voltage across the electrodes 9. The source voltage is fed to the input of switching circuit 31 through a calibration device consisting of a multiplying digital to analog converter 37 controlled by a manually programmable set of digital switches 39.

The gate of the trigger circuit 29 is connected through a divide-by-M circuit 41 to the output of voltage controlled oscillator 23. The edge of a pulse from the output of divide-by-M circuit 41 permits the passage of a pulse of width proportional to the period of the reference frequency source through the trigger circuit 29 to the gate of the switching circuit 31. The trigger circuit 29 and reference frequency 25 act as a highly stable digital retriggerable monostable multivibrator.

The switching circuit 31 is gated on and off by pulses from the trigger circuit 29 to produce pulses having the amplitude of the reference voltage source 27 and a duty cycle proportional to the ratio of the frequency $F_{out}$ of the output frequency from the voltage controlled oscillator 23 to the reference frequency 25. The output of the switching circuit 31 is applied to the low pass filter 33 where it is smoothed and then to the input of the high gain difference amplifier 19.

It will be seen that the feedback system maintains the linearity of the voltage to frequency converter of the invention, regardless of the linearity of the voltage controlled oscillator 23, so long as the output of the VCO 23 is monotonic.

Since the voltage loop is in lock when the input voltage is equal to the reference voltage times the duty cycle of the feedback voltage, the following equation defines the lock condition of the system:

$$V_{in} = V_{ref} \times \text{duty cycle} = V_{ref} \times K \times F_{out}F_{ref}$$

or $$F_{out} = K \times V_{in} \times F_{ref}/V_{ref}$$

where K is a constant determined by the digital processing of the circuit.

The foregoing analysis holds true so long as the reference frequency is more than twice the output frequency, the reference voltage is more than twice the input voltage, and the voltage controlled oscillator 23 is able to operate at the required frequency. If by means of special switching circuitry, the digital one shot multivibrator is permitted to run at 100% duty cycle, the reference frequency need only be as great as the maximum permissible frequency of the voltage controlled oscillator 23 divided by M.

Figure 2:
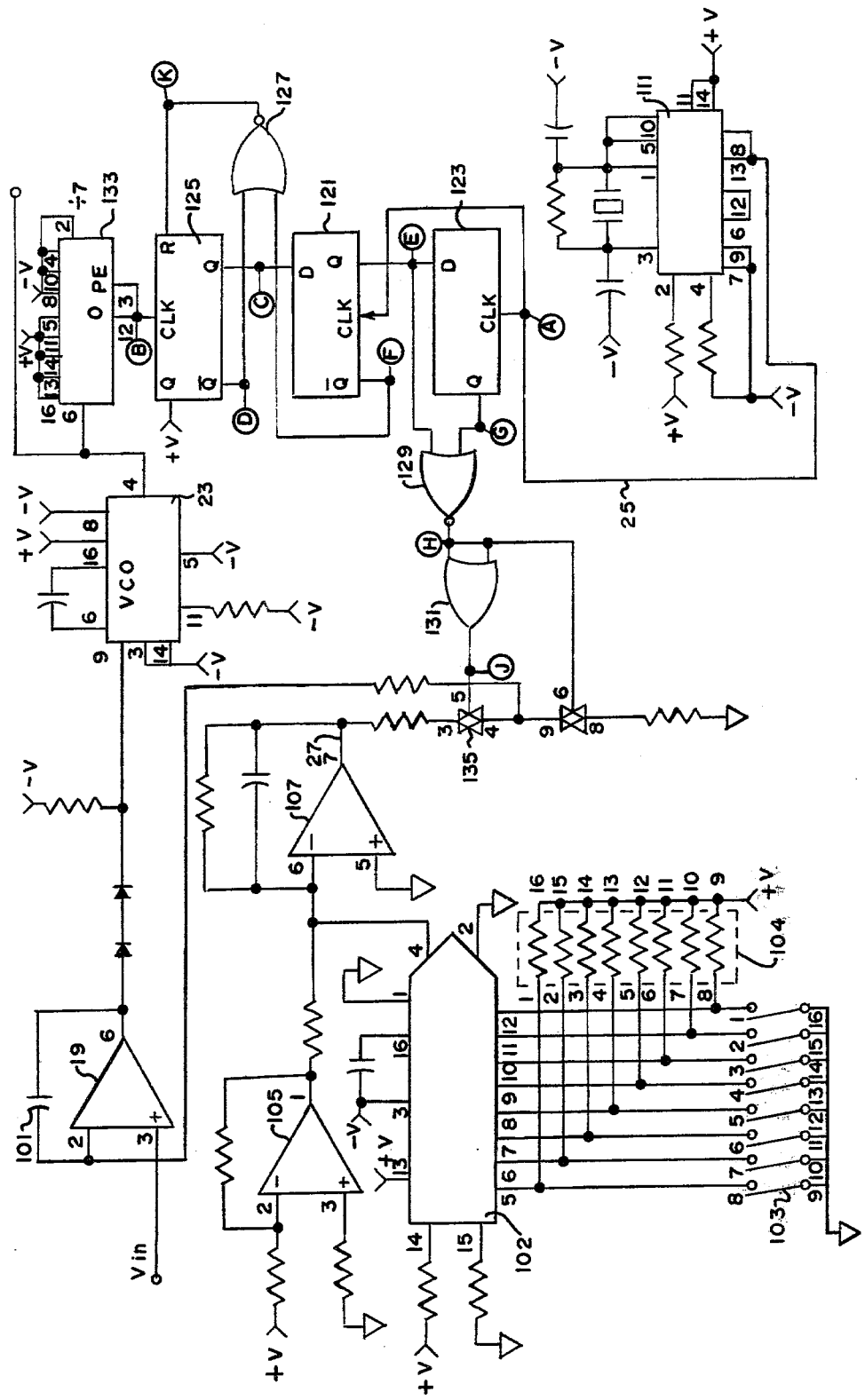
FIG. 2 is a circuit diagram of the voltage to frequency converter of FIG. 1, showing details thereof.

Referring now to FIG. 2 for certain details of the preferred embodiment, the operational amplifier 19 is preferably a low offset type, such as an OP-07 made by Precision Monolithics Inc. The low pass filter 33 is most conveniently a one microfarad capacitor 101, connected between the output of the amplifier 19 and its non-inverting input. The capacitor 101 performs both a filtering and an integrating function. The voltage controlled oscillator 23 may be the VCO section of a CMOS integrated circuit phase-locked loop sold by Motorola Semiconductor Products Inc. as its MC14046B chip. This VCO has a maximum frequency at five volts (source and drive) of about 0.7 MHz, a temperature stability of about 0.12%/degree C, and a linearity of about one percent.

The reference frequency 25 may be generated by a crystal Y1 connected to a Motorola MC14007UB multipurpose device 111 connected as an oscillator and pulse shaper.

The reference voltage 27 is generated by a standard integrated circuit digital to analog converter 102, connected to ground through a set of solderable contacts 103 and through a corresponding package of matched resistors 104 to the positive voltage source, to permit the output of the converter 37 to be set by selectively soldering the appropriate contacts. The output of the converter 37 is connected between a first operational amplifier 105 and a second operational amplifier 107 to modify the voltage at the output of the second amplifier 107.

The trigger circuit 29 comprises three halves 121, 123 and 125 of a Motorola MC14013B dual type D flip-flop, and three NOR gates 127, 139 and 131 of a Motorola MC14001B quad NOR gate.

Figure 3:
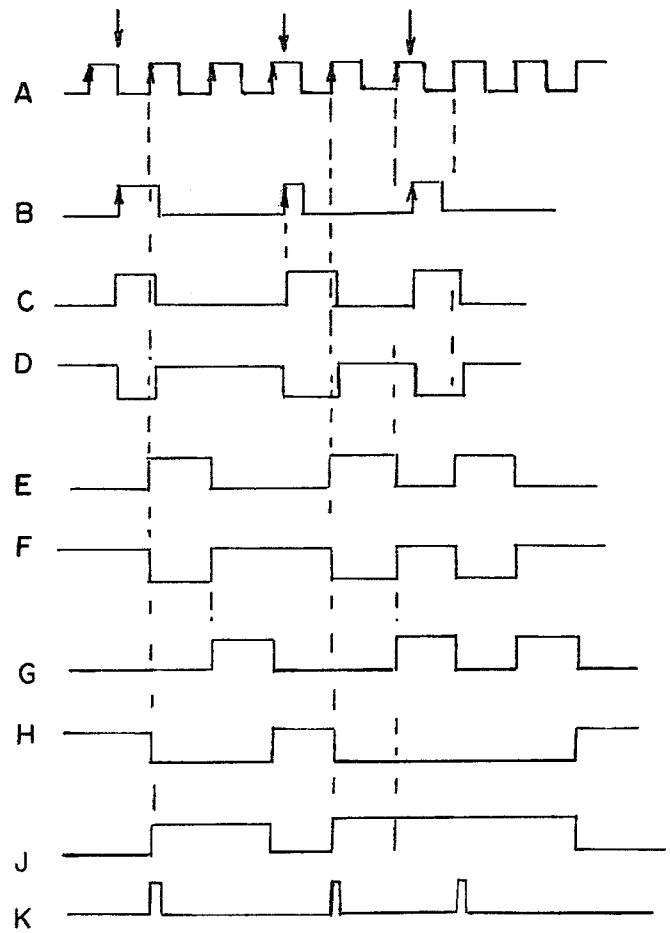
FIG. 3 is a timing diagram for the circuit of FIG. 2.

The output of the VCO 23 is fed into the clock input of a Motorola MC14526 programmable divide-by-N four-bit counter 133 which acts as a multiplying factor in the feedback loop. The counter is arranged to divide by seven, and its output is connected to the block input of flip-flop 125. The operation of the trigger circuit 29 will best be understood in connection with the timing diagram, FIG. 3. Briefly, "up" clocking pulses at A following an output pulse from the divide-by-N counter 133 produce a pulse at E having a width of one clock cycle and a second pulse at G of the same width but displaced one clock cycle. The output H of NOR gate 129 is therefore a negative going pulse having a width equal to two clock cycles for each input pulse received at B. This output is inverted and triggers a solid state FET switch 135 to provide a pulse of controlled width as the inverting input of operational amplifier 19. The flip-flop 125 acts as a holding circuit to ensure that if an input pulse is received at B while the output at J is high, the output will remain high. Therefore, the triggering circuit is capable of providing a one hundred percent duty cycle.

Numerous variations in the converter of the present invention, within the scope of the appended claims, will occur to those skilled in the art in light of the foregoing disclosure. For example, because the ratio of output frequency to reference frequency is proportional to the ratio of input voltage to reference voltage, the absolute value of the reference voltage may not be critical. As another example, a comparison of the count of the reference pulses and the output pulses permits the circuit to act as a highly accurate, low cost analog to digital converter. These variations are merely illustrative. We claim:

1. In a flowmeter producing an output voltage dependent on flow rate, and including means for converting said output voltage to a digital signal, the improvement wherein said means for converting said output voltage to a digital signal comprises a high precision voltage to frequency converter system comprising frequency generating means for receiving said output voltage as an input signal and producing a variable frequency output signal dependent on the amplitude of the input signal, means for generating a reference frequency, trigger means responsive to said output signal and to said reference frequency for producing a feedback signal having a duty cycle proportional of the ratio of said input frequency and said reference frequency, and switching means for producing an output signal having an amplitude dependent on said reference voltage and a duty cycle equal to the duty cycle of said second signal, and filter means for deriving said output voltage from said output signal.

2. The improvement of claim 1 wherein said flowmeter is a magnetic flowmeter comprising a body adapted to be connected in a flow system for measuring the flow of a fluid therethrough, means for generating a magnetic field in said fluid flowing through said body, and means for producing an output voltage dependent on the electric field generated in said fluid flowing through said magnetic field.

3. The improvement of claim 2 wherein said reference voltage is derived from said means for generating a magnetic field in said fluid.

4. The improvement of claim 2 further comprising digital calibration means for producing a predetermined digital output at a selected flowrate, said calibration means comprising a plurality of digitally settable means for varying said reference voltage.

5. The improvement of claim 1 further comprising digital calibration means for producing a predetermined digital output at a selected flowrate, said calibration means comprising a plurality of digitally settable means for varying said reference voltage.

6. In a flowmeter producing a frequency output dependent on flow rate, the improvement comprising a precision frequency to voltage converter system for receiving said frequency output as an input frequency and producing an output voltage proportional to said input frequency, said system comprising means for generating a reference frequency, means for generating a reference voltage, trigger means responsive to said input frequency and to said reference frequency for producing a second signal having a duty cycle dependent on the relationship between the frequencies of said output signal and said reference frequency, reference voltage means for controlling the amplitude of said feedback signal, and comparator means for receiving said feedbadk signal and said input signal and applying to said frequency generating means a signal dependent on the relationship between said input signal and the average value of said feedback signal.

7. The improvement of claim 6 wherein said flowmeter is a magnetic flowmeter comprising a body adapted to be connected in a flow system for measuring the flow of a fluid therethrough, means for generating a magnetic field in said fluid flowing through said body, means for producing an output voltage dependent on the electric field generated in said fluid flowing through said magnetic field, and means for deriving said frequency output from said output voltage and wherein said reference voltage is derived from said means for generating a magnetic field in said fluid.

8. In a magnetic flowmeter comprising a body adapted to be connected in a flow system for measuring the flow of a fluid therethrough, means for generating a magnetic field in said fluid flowing through said body, means for producing an output voltage dependent on the electric field generated in said fluid flowing through said magnetic field, and means for converting said output voltage to a digital signal, the improvement comprising digital calibration means for producing a predetermined digital output at a selected flowrate, said calibration means comprising feedback means responsive to said digital signal and to a reference signal for producing a feedback voltage dependent on said digital signal and said reference signal, comparator means responsive to said output voltage and to said feedback voltage for producing a difference signal, and a plurality of digitally settable means for varying said reference signal.

9. The improvement of claim 8 wherein said digital signal comprises a train of signals having a frequency indicative of flow rate.

10. The improvement of claim 8 wherein said reference signal is derived from said means for generating a magnetic field in said fluid.

* * * * *